US010672977B2

(12) United States Patent
Guo

(10) Patent No.: US 10,672,977 B2
(45) Date of Patent: *Jun. 2, 2020

(54) PERPENDICULAR MAGNETORESISTIVE ELEMENTS

(71) Applicant: Yimin Guo, San Jose, CA (US)

(72) Inventor: Yimin Guo, San Jose, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 14/063,204

(22) Filed: Oct. 25, 2013

(65) Prior Publication Data

US 2014/0175428 A1 Jun. 26, 2014

Related U.S. Application Data

(60) Provisional application No. 61/740,764, filed on Dec. 21, 2012.

(51) Int. Cl.
H01L 43/10 (2006.01)
H01L 43/08 (2006.01)

(52) U.S. Cl.
CPC ............. H01L 43/10 (2013.01); H01L 43/08 (2013.01)

(58) Field of Classification Search
CPC .. H01L 43/08; G11C 11/14–16; G11C 11/161
See application file for complete search history.

(56) References Cited

U.S. PATENT DOCUMENTS

| | | | |
|---|---|---|---|
| 2008/0088980 A1* | 4/2008 | Kitagawa et al. | 360/313 |
| 2009/0251951 A1* | 10/2009 | Yoshikawa et al. | 365/158 |
| 2010/0118600 A1* | 5/2010 | Nagase et al. | 365/158 |
| 2012/0018825 A1* | 1/2012 | Lim et al. | 257/421 |
| 2012/0068284 A1* | 3/2012 | Kitagawa et al. | 257/421 |
| 2012/0146167 A1* | 6/2012 | Huai | G11C 11/161 257/421 |
| 2012/0280336 A1* | 11/2012 | Jan | H01L 43/08 257/421 |
| 2014/0203341 A1* | 7/2014 | Guo | 257/295 |
| 2014/0203383 A1* | 7/2014 | Guo | 257/421 |
| 2014/0210025 A1* | 7/2014 | Guo | 257/421 |
| 2014/0217526 A1* | 8/2014 | Guo | 257/421 |
| 2014/0254252 A1* | 9/2014 | Guo | 365/158 |

* cited by examiner

Primary Examiner — Allison Bernstein

(57) ABSTRACT

A perpendicular magnetoresistive element includes a novel recording layer being a multi-layer comprising a first Co-alloy layer including at least one of CoFeB, CoFeB/CoFe and CoFe/CoFeB, a second Co-alloy layer including at least one of CoFeB and CoB, an insertion layer provided between the first Co-alloy layer and the second Co-alloy layer and containing at least one element selected from Zr, Nb, W, Mo, Ru and having a thickness less than 0.5 nm, and a novel buffer layer having rocksalt crystal structure(s) interfacing to the recording layer with lattice parameter mismatch between 3% and 18%. The magnetoresistive element is annealed at an elevated temperature and both the first Co-alloy layer and the second Co-alloy layer are crystallized to form body-center cubic (bcc) CoFe or bcc Co grain having epitaxial growth with (100) plane parallel to substrate and with in-plane expansion and out-of-plane contraction.

9 Claims, 1 Drawing Sheet

Present Invention

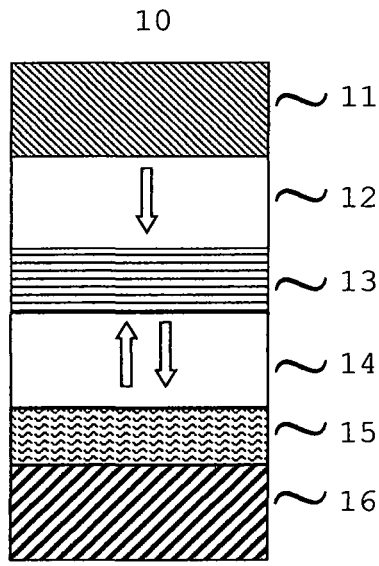
Figure 1. Present Invention
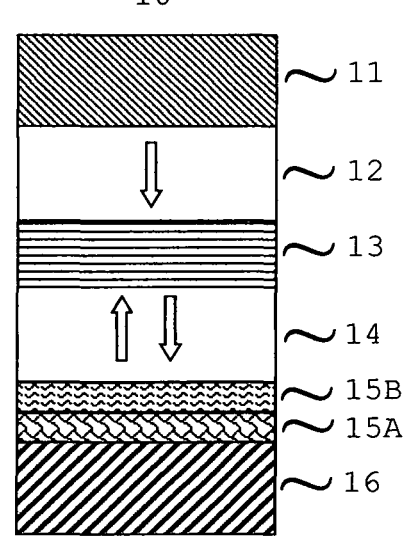
Figure 2. Present Invention
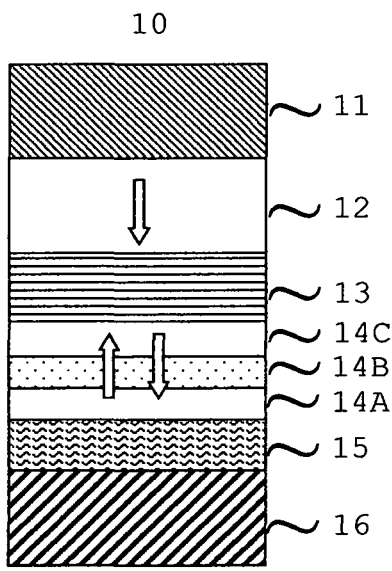
Figure 3. Present Invention
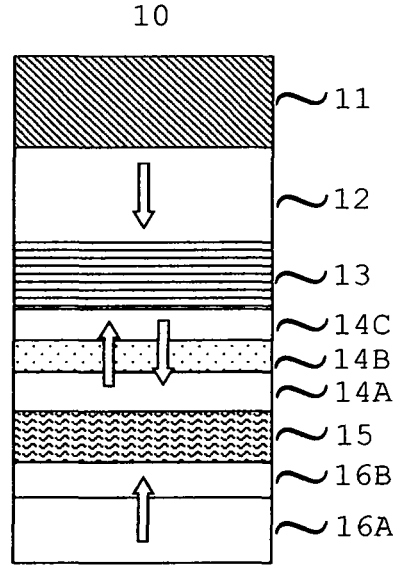
Figure 4. Present Invention

PERPENDICULAR MAGNETORESISTIVE ELEMENTS

RELATED APPLICATIONS

This application claims the priority benefit of U.S. Provisional Application No. 61,740,764, filed Dec. 21, 2012, which is incorporated herein by reference.

BACKGROUND OF THE INVENTION

1. Field of the Invention

This invention relates to the field of perpendicular magnetoresistive elements. More specifically, the invention comprises perpendicular spin-transfer-torque magnetic-random-access memory (MRAM) using perpendicular magnetoresistive elements as basic memory cells which potentially replace the conventional semiconductor memory used in electronic chips, especially mobile chips for power saving and non-volatility.

2. Description of the Related Art

In recent years, magnetic random access memories (hereinafter referred to as MRAMs) using the magnetoresistive effect of ferromagnetic tunnel junctions (also called MTJs) have been drawing increasing attention as the next-generation solid-state nonvolatile memories that can cope with high-speed reading and writing, large capacities, and low-power-consumption operations. A ferromagnetic tunnel junction has a three layer stack structure formed by stacking a recording layer having a changeable magnetization direction, an insulating spacing layer, and a fixed layer that is located on the opposite side from the recording layer and maintains a predetermined magnetization direction.

As a write method to be used in such magnetoresistive elements, there has been suggested a write method (spin torque transfer switching technique) using spin momentum transfers. According to this method, the magnetization direction of a recording layer is reversed by applying a spin-polarized current to the magnetoresistive element. Furthermore, as the volume of the magnetic layer forming the recording layer is smaller, the injected spin-polarized current to write or switch can be also smaller. Accordingly, this method is expected to be a write method that can achieve both device miniaturization and lower currents.

Further, as in a so-called perpendicular MTJ element, both of the two magnetization films have easy axis of magnetization in a direction perpendicular to the film plane due to their strong magnetic crystalline anisotropy (shape anisotropies are not used), and accordingly, the device shape can be made smaller than that of an in-plane magnetization type. Also, variance in the easy axis of magnetization can be made smaller. Accordingly, by using a material having a large magnetic crystalline anisotropy, both miniaturization and lower currents can be expected to be achieved while a thermal disturbance resistance is maintained.

There has been a known technique for achieving a high MR ratio by forming a crystallization acceleration film that accelerates crystallization and is in contact with an interfacial magnetic film having an amorphous structure. As the crystallization acceleration film is formed, crystallization is accelerated from the tunnel barrier layer side, and the interfaces with the tunnel barrier layer and the interfacial magnetic film are matched to each other. By using this technique, a high MR ratio can be achieved. However, where a MTJ is formed as a device of a perpendicular magnetization type, the materials of the recording layer typically used in an in-plane MTJ for both high MR and low damping constant as required by low write current application normally don't have enough magnetic crystalline anisotropy to achieve thermally stable perpendicular magnetization against its demagnetization field. In order to obtain perpendicular magnetization with enough thermal stability, the recording layer has to be ferromagnetically coupled to additional perpendicular magnetization layer, such as TbCoFe, or CoPt, or multilayer such as (Co/Pt)n, to obtain enough perpendicular anisotropy. Doing so, reduction in write current becomes difficult due to the fact that damping constant increases from the additional perpendicular magnetization layer and its associated seed layer for crystalline matching and material diffusion during the heat treatment in the device manufacturing process.

In a spin-injection MRAM using a perpendicular magnetization film, a write current is proportional to the damping constant and inversely proportional to a spin polarization, and increases in proportional to a square of an area size. Therefore, reduction of the damping constant, increase of the spin polarization, maintain of the perpendicular anisotropy and reduction of an area size are mandatory technologies to reduce the write current.

BRIEF SUMMARY OF THE PRESENT INVENTION

The present invention comprises perpendicular magnetoresistive element for perpendicular spin-transfer-torque MRAM. The perpendicular magnetoresistive element in the invention are sandwiched between an upper electrode and a lower electrode of each MRAM memory cell, which also comprises a write circuit which bi-directionally supplies a spin polarized current to the magnetoresistive element and a select transistor electrically connected between the magnetoresistive element and the write circuit.

The invention includes a magnetoresistive element comprising: a recording layer having magnetic anisotropy in a direction perpendicular to a film surface and having a variable magnetization direction; a reference layer having magnetic anisotropy in a direction perpendicular to a film surface and having an invariable magnetization direction; a spacing layer provided between the recording layer and the reference layer; and a buffer layer provided on a surface of the recording layer, which is opposite to a surface of the recording layer where the spacing layer is provided, wherein at least the portion of the buffer layer interfacing to the recording layer contains a rocksalt crystal structure having the (100) plane parallel to the substrate plane and with lattice parameter along its {110} direction being slightly larger than the bcc (body-centered cubic)-phase Co lattice parameter along {100} direction; and a base layer provided on a surface of the buffer layer, which is opposite to a surface of the buffer layer where the recording layer is provided.

As an amorphous ferromagnetic material, like CoFeB, in the recording layer is thermally annealed, a crystallization process occurs to form bcc CoFe grains having epitaxial growth with (100) plane parallel to surface of the rocksalt crystal buffer layers with in-plane expansion and out-of-plane contraction. Accordingly, a perpendicular anisotropy, as well as a perpendicular magnetization, is induced in the recording layer. The invention preferably includes materials, configurations and processes of perpendicular magnetoresistive elements.

BRIEF DESCRIPTION OF THE DRAWINGS

FIG. 1 is a cross-sectional view showing a configuration of an MTJ element 10 according to the first embodiment;

FIG. 2 is a cross-sectional view showing a configuration of an MTJ element 10 according to the second embodiment;

FIG. 3 is a cross-sectional view showing a configuration of an MTJ element 10 according to the third embodiment;

FIG. 4 is a cross-sectional view showing a configuration of an MTJ element 10 according to the fourth embodiment;

DETAILED DESCRIPTION OF THE INVENTION

In general, according to one embodiment, there is provided a magnetoresistive element comprising:

a recording layer having magnetic anisotropy in a direction perpendicular to a film surface and having a variable magnetization direction;

a reference layer having magnetic anisotropy in a direction perpendicular to a film surface and having an invariable magnetization direction;

a spacing layer provided between the recording layer and the reference layer;

a buffer layer provided on a surface of the recording layer, which is opposite to a surface of the recording layer where the spacing layer is provided, wherein at least the portion of the buffer layer interfacing to the recording layer contains a rocksalt crystal structure having the (100) plane parallel to the substrate plane and with lattice parameter along its {110} direction being larger than the Co lattice parameter along {100} direction in its bcc (body-centered cubic) phase.

and a base layer provided on a surface of the buffer layer, which is opposite to a surface of the buffer layer where the recording layer is provided.

First Embodiment

FIG. 1 is a cross-sectional view showing a configuration of an MTJ element 10 as a MTJ element according to the first embodiment. The MTJ element 10 is configured by stacking an upper electrode 11, a reference layer 12, a spacing layer (tunnel barrier layer) 13, a recording layer 14, a buffer layer 15, and a base layer 16 in this order from the top.

The recording layer 14 and reference layer 12 each are made of a ferromagnetic material, and have uni-axial magnetic anisotropy in a direction perpendicular to a film surfaces. Further, directions of easy magnetization of the recording layer 14 and reference layer 12 are also perpendicular to the film surfaces. In another word, the MTJ element 10 is a perpendicular MTJ element in which magnetization directions of the recording layer 14 and reference layer 12 face in directions perpendicular to the film surfaces. A direction of easy magnetization is a direction in which the internal magnetic energy is at its minimum where no external magnetic field exists. Meanwhile, a direction of hard magnetization is a direction which the internal energy is at its maximum where no external magnetic field exists.

The recording layer 14 has a variable (reversible) magnetization direction. The reference layer 12 has an invariable (fixing) magnetization direction. The reference layer 12 is made of a ferromagnetic material having a perpendicular magnetic anisotropic energy which is sufficiently greater than the recording layer 14. This strong perpendicular magnetic anisotropy can be achieved by selecting a material, configuration and a film thickness. In this manner, a spin polarized current may only reverse the magnetization direction of the recording layer 14 while the magnetization direction of the reference layer 12 remains unchanged. An MTJ element 10 which comprises a recording layer 14 having a variable magnetization direction and a reference layer 12 having an invariable magnetization direction for a predetermined write current can be achieved.

The spacing layer 13 is made of a non-magnetic material for which a non-magnetic insulating metal oxide or nitride can be used.

The buffer layer 15 may serve to introduce or improve perpendicular magnetic anisotropy of the recording layer 14. A damping constant of the recording layer 14 sometimes increases (deteriorates) depending on a material in contact with the recording layer 14, which is known as a spin pumping effect. The buffer layer 15 may also have a function to prevent increase of the damping constant of the recording layer 14 by reducing the spin pumping. The buffer layer 15 is made of an oxide (or nitride, chloride) layer which has a rocksalt crystalline as its naturally stable structure thereof will be described later.

An example configuration of the MTJ element 10 will be described below. The reference layer 12 is made of TbCoFe (around 10 nm)/CoFeB (around 2 nm). The spacing layer 13 is made of MgO (around 1 nm). The recording layer 14 is made of CoFeB (around 1.2 nm). The buffer layer 15 is made of MgZnO (around 0.8 nm). The base layer 16 is made of Ta (around 20 nm)/Cu (around 20 nm)/Ta (around 20 nm). Each element written in the left side of "/" is stacked above an element written in the right side thereof.

Since a high resistance layer can be formed when the MgZnO buffer layer is used, a read output is caused to decrease when a read current flows across MgZnO buffer layer. A resistance of the MgZnO buffer layer can be reduced and decrease of the read output can accordingly be reduced by adopting a surface oxidization process, i.e. by using of a mixed gas containing natural oxygen ($O_2$), or radical or ionized oxygen and Argon (Ar) after co-sputtering Mg and Zn metal layer. Such MgZnO composition contains less oxygen in the portion of the buffer layer facing to the base layer than the composition by sputtering of MgZnO or co-sputtering of Mg and Zn in a mixed gas containing oxygen ($O_2$) and Argon (Ar).

The CoFeB (with B content no less than 10% and no more than 30%) layer comprised in the recording layer 14 is formed into an amorphous state as deposited. The MgZnO layer comprised in the buffer layer 15 is formed into rocksalt crystal grains with the (100) plane parallel to the substrate plane. In the rocksalt crystal structure, two fcc sublattices for metal atom (Mg or Zn) and O, each displaced with respect to the other by half lattice parameter along the [100] direction. Its lattice parameter along the {110} direction is ranged from 2.98 to 3.02 angstrom, which has slightly larger than bcc CoFe lattice parameter along {100} direction and has a lattice mismatch between 4% and 7%. After thermal annealing with a temperature higher than 250-degree, the amorphous CoFeB is crystallized to form bcc CoFe grains having epitaxial growth with (100) plane parallel to surface of the rocksalt crystal buffer layers with in-plane expansion and out-of-plane contraction. Accordingly, a perpendicular magnetization is induced in the recording layer.

Second Embodiment

FIG. 2 is a cross-sectional view showing an example configuration of the MTJ element 10 according to the second embodiment. As shown in FIG. 2, the buffer layer 15 has a multi-layer structure in which, as an example, a first buffer layer 15A, and a second buffer layer 15B are stacked in this order from the bottom. The first buffer layer 15A is made of MgO, and the second buffer layer 15B is made of ZnO. Naturally, MgO can easily form stable rocksalt crystal grains, while ZnO typically forms hexagonal crystal structure, instead of rocksalt crystal. Once a MgO seed layer having a rocksalt crystal with a cubic lattice plane (100) as a substrate, ZnO rocksalt crystal grains can readily epitaxially grow on top of MgO layer. The lattice mismatch between ZnO along {110} direction and bcc CoFe along {100} direction is slightly higher than that between MgO and bcc CoFe, a stronger perpendicular anisotropy is expected in the recording layer. In general, the buffer layer may have a multi-layer of oxide, or nitride, or chloride having rocksalt crystal structure and containing at least one element selected from Na, Li, Mg, Ca, Zn, Cd, In, Sn, Cu, Ag, Ti, Ni, Si. Within the multi-layer buffer layer, the sub-layer adjacent to the recording layer has naturally stable rocksalt metal oxide selected from MgO, CaO, MgZnO, CdO, MgCdO, CdZnO. Accordingly, the thermal energy stability of the perpendicular MRAM improves.

Third Embodiment

FIG. 3 is a cross-sectional view showing an example configuration of the MTJ element 10 according to the third embodiment. As shown in FIG. 3, the recording layer 14 has a multi-layer structure in which a first ferromagnetic layer 14A, a nonmagnetic insertion layer 14B, and a second ferromagnetic layer 14C are stacked in this order from the bottom, and rest layers are the same as shown in FIG. 1. An example configuration will be described below. The first ferromagnetic layer 14A is CoFeB (around 0.8 nm), the insertion layer 14B is Ta (around 0.3 nm), and the second magnetic layer 14C is CoFeB (around 0.6 nm). From layer 14A to layer 14C, the Fe composition relative to Co is increased to improve MR ratio. Further, the perpendicular magnetic anisotropy can be improved by a thermal annealing process in which B atoms move toward the insertion Ta layer.

Fourth Embodiment

FIG. 4 is a cross-sectional view showing an example configuration of the MTJ element 10 according to the fourth embodiment. The base layer 16 has a bi-layer structure in which a first base layer 16A is TbCoFe (around 20 nm), and a second base layer 16B is CoFeB (around 2 nm). The reference layer 12 is a multi-layer (Pd/Co)n/CoFeB (around 1 nm). (Pd/Co)n is a superlattice structure which enables a strong perpendicular anisotropy. Both the base layer and reference layer have perpendicular magnetizations, however a careful selection of these layer structures can be made to make them have different perpendicular anisotropy or coercive forces so that they can be set towards opposite directions by applying external perpendicular magnetic fields. A careful selection of magnetic base layer and reference layer with opposite perpendicular magnetizations would lead near-zero or zero perpendicular stray field acting on the recording layer, accordingly, the thermal stability is improved.

While certain embodiments have been described above, these embodiments have been presented by way of example only, and are not intended to limit the scope of the inventions. For an example, the perpendicular MTJ element in each embodiment may have reversed layer-by-layer sequence. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A magnetoresistive element comprising:
a reference layer having a magnetic anisotropy in a direction perpendicular to a film surface and having an invariable magnetization direction;
a tunnel barrier layer provided on a surface of the reference layer;
a recording layer provided on a surface of the tunnel barrier layer, which is opposite to the surface of the reference layer, having a magnetic anisotropy in a direction perpendicular to a film surface and having a variable magnetization direction, wherein the recording layer contains a body-centered cubic (bcc) crystal structure having the (100) plane parallel to the substrate plane and is a multi-layer comprising a first Co-alloy layer immediately adjacent to said tunnel barrier layer including at least one of CoFeB, CoFeB/CoFe and CoFe/CoFeB, a second Co-alloy layer including at least one of CoFeB and CoB, an insertion layer provided between the first Co-alloy layer and the second Co-alloy layer and containing at least one element selected from Zr, Nb, W, Mo, Ru and having a thickness less than 0.5 nm;
a buffer layer provided on a surface of the recording layer, which is opposite to the surface of the tunnel barrier layer, wherein at least a portion of the buffer layer interfacing with the recording layer comprises a rocksalt crystal structure having a (100) plane parallel to the substrate plane and having a first lattice parameter along a {110} direction of the rocksalt crystal structure of the buffer layer being larger than a second lattice parameter along a {100} direction of the bcc crystal of the recording layer by a first difference;
and a base layer provided on a surface of the buffer layer, which is opposite to the surface of the recording layer.

2. The element of claim 1, wherein said buffer layer comprises a single layer of oxide, or nitride, or chloride having a rocksalt crystal structure with at least one element selected from Na, Li, Ca, Zn, Cd, In, Sn, Cu, Ag, Ni, and Si, or a metal oxide layer having naturally stable rocksalt crystal structure selected from MgO, CaO, ZnO, CdO, MgZnO, MgCdO, and CdZnO, or a metal oxide layer selected from MgO, CaO, ZnO, CdO, MgZnO, MgCdO, and CdZnO having less oxygen in the portion of said buffer layer interfacing to said base layer.

3. The element of claim 1, wherein said buffer layer comprises a multi-layer of oxide, or nitride, or chloride having rocksalt crystal structure with at least one element selected from Na, Li, Ca, Zn, Cd, In, Sn, Cu, Ag, Ni, and Si.

4. The element of claim 1, wherein both said first Co-alloy layer and said second Co-alloy layer comprise Boron elements with the Boron, composition percentage between 10% and 30%.

5. The element of claim 1, wherein said first difference is between 3% and 18%.

6. The element of claim 1, wherein said magnetoresistive element is annealed at an elevated temperature and both said first Co-alloy layer and second Co-alloy layer are crystallized to form bcc CoFe or bcc Co grain having epitaxial growth with (100) plane parallel to substrate between said tunnel barrier layer and said rocksalt crystal buffer layer and with in-plane expansion and out-of-plane contraction.

7. The element of claim 1, wherein said base layer is a non-magnetic metal layer selected from Ta, Ti, W, Nb, Mo, V, Ru, Cu, Al, and Zr.

8. The element of claim 1, wherein said base layer is a non-magnetic nitride layer selected from AlN, NbN, ZrN, IrN, and SiN.

9. The element of claim 1, wherein said tunnel barrier layer is made of non-magnetic metal oxide or metal nitride layer, with at least one of MgO, ZnO, and MgZnO, MgN, ZnN, and MgZnN.

* * * * *